US012811552B2

(12) United States Patent
Qian et al.

(10) Patent No.: US 12,811,552 B2
(45) Date of Patent: Nov. 24, 2026

(54) ADAPTIVE EQUALIZER DEVICE

(71) Applicant: SigmaStar Technology Ltd., Xiamen (CN)

(72) Inventors: Yuan Cheng Qian, Shanghai (CN); Zhen Yang Pang, Shanghai (CN); Tian Li Qu, Shanghai (CN)

(73) Assignee: SIGMASTAR TECHNOLOGY LTD., Xiamen (CN)

( * ) Notice: Subject to any disclaimer, the term of this patent is extended or adjusted under 35 U.S.C. 154(b) by 237 days.

(21) Appl. No.: 18/961,837

(22) Filed: Nov. 27, 2024

(65) Prior Publication Data

US 2025/0211185 A1 Jun. 26, 2025

(30) Foreign Application Priority Data

Dec. 25, 2023 (CN) ........................ 202311801248.3

(51) Int. Cl.

| | |
|---|---|
| ***H03F 3/45*** | (2006.01) |
| ***H03F 3/04*** | (2006.01) |
| ***H03G 3/30*** | (2006.01) |
| ***H04L 25/03*** | (2006.01) |

(52) U.S. Cl.
CPC ................ *H03G 3/30* (2013.01); *H03F 3/04* (2013.01); *H04L 25/03019* (2013.01); *H03F 2200/375* (2013.01)

(58) Field of Classification Search
CPC .... H03F 3/45; H03F 3/45071; H03F 3/45085; H03F 3/45089
See application file for complete search history.

(56) References Cited

U.S. PATENT DOCUMENTS 7,132,882 B2 * 11/2006 Chen .................. H03F 3/45085 330/308
8,183,921 B1 * 5/2012 Narayan ............ H03F 3/45197 330/9
2010/0135442 A1 * 6/2010 Kocaman ................ H03F 3/195 375/346

* cited by examiner

*Primary Examiner* — Henry Choe
(74) *Attorney, Agent, or Firm* — Edell, Shapiro & Finnan, LLC

(57) ABSTRACT

An adaptive equalizer device includes multiple equalizer circuits, multiple gain stage circuits, a digital offset correction circuit and an analog offset correction circuit. The equalizer circuits are coupled in series and compensate multiple input signals to generate multiple first output signals. The gain stage circuits are coupled in series and amplify the first output signals to generate multiple second output signals. The digital offset correction circuit adjusts DC levels of the first output signals according to the second output signals. The analog offset correction circuit adjusts multiple input levels of the last equalizer circuit of the equalizer circuits according to the second output signals, wherein the last equalizer circuit is configured to output the first output signals.

14 Claims, 8 Drawing Sheets

ADAPTIVE EQUALIZER DEVICE

This application claims the benefit of China application Serial No. CN202311801248.3, filed on Dec. 25, 2023, the subject matter of which is incorporated herein by reference.

BACKGROUND OF THE INVENTION

Field of the Invention

The present application relates to an equalizer device, and more particularly to a continuous time equalizer device having a mechanism adaptively adjusting circuit parameters.

Description of the Related Art

An equalizer is usually utilized in a receiving end of a serializer/deserializer (SerDes) application to process input signals in which inter-symbol interference is generated due to channel or transmission line attenuation. In some existing circuit configurations, a time continuous equalizer uses constant circuit parameters (for example, constant capacitance values and constant resistance values) to compensate for channel attenuation of the signals above. However, since the circuit parameters are constant, a frequency range for channel compensation provided by the equalizer above is rather limited. If currently applied input signals have a broader frequency range, the equalizer circuit above may fail to meet requirements of current applications.

SUMMARY OF THE INVENTION

In some embodiments, it is an object of the present application to provide continuous time equalizer device having a mechanism adaptively adjusting circuit parameters, so as to improve the drawbacks of the prior art.

In some embodiments, an equalizer device includes multiple equalizer circuits, multiple gain stage circuits, a digital offset correction circuit and an analog offset correction circuit. The equalizer circuits are coupled in series and compensate multiple input signals to generate multiple first output signals. The gain stage circuits are coupled in series and amplify the first output signals to generate multiple second output signals. The digital offset correction circuit adjusts DC levels of the first output signals according to the second output signals. The analog offset correction circuit adjusts multiple input levels of the last equalizer circuit of the equalizer circuits according to the second output signals, wherein the last equalizer circuit is configured to output the first output signals.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
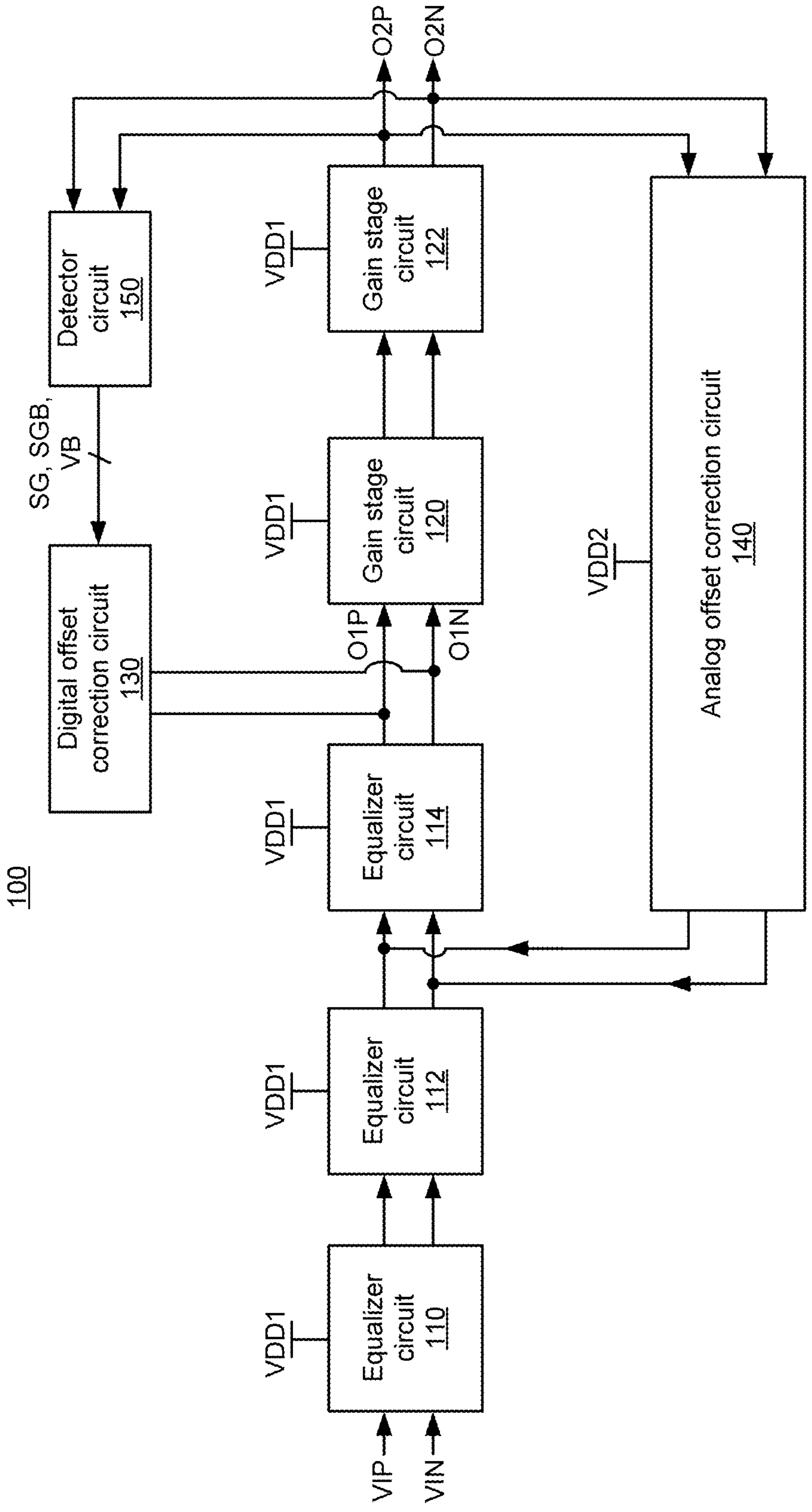
FIG. 1 is a schematic diagram of an equalizer device according to some embodiments of the present application.

FIG. 1 shows a schematic diagram of an equalizer device 100 according to some embodiments of the present application. In some embodiments, the equalizer device 100 is capable of compensating attenuation in signals (for example, an input signal VIN and an input signal VIP) caused by a channel or a transmission line. In some embodiments, the equalizer device 100 includes multiple adaptive circuit parameter adjustment mechanisms, which are capable of configuring a frequency response of the equalizer device 100 according to application requirements (for example, different frequencies of the input signal VIN and the input signal VIP), thereby compensating the input signal VIN and the input signal VIP having different frequencies.

The equalizer device 100 includes multiple equalizer circuits 110, 112 and 114, multiple gain stage circuits 120 and 122, a digital offset correction circuit 130, an analog offset correction circuit 140 and a detector circuit 150. The multiple equalizer circuits 110, 112 and 114 are coupled in series, and compensate the input signal VIN and the input signal VIP to generate an output signal O1P and an output signal O1N. In some embodiments, the multiple equalizer circuits 110, 112 and 114 may provide a frequency response having a peaking frequency, so as to compensate the input signal VIN and the input signal VIP. The multiple equalizer circuits 110, 112 and 114 may provide larger voltage gains for the peaking frequency, so as to compensate for transmission line (or channel) attenuation suffered by the input signal VIN and the input signal VIP. In some embodiments, at least one circuit parameter of each of the multiple equalizer circuits 110, 112 and 114 is configured according to frequencies of the input signal VIN and the input signal VIP. In some embodiments, the at least one circuit parameter may include a resistance value (for example, respective resistance values of multiple resistors RL1, RL2 and RS in FIG. 2A to FIG. 2C) and a current value (for example, current values generated by multiple current source circuits 220 and 240 in FIG. 2A to FIG. 2C), a capacitance value (for example, respective capacitance values of multiple capacitors CN and CS in FIG. 2A to FIG. 2C), or a combination thereof. That is, the at least one circuit parameter may be a resistance value and a current value, a current value, or a resistance value, a current value and a current value. Associated details of the configuration herein are to be described with reference to FIG. 2A to FIG. 2C below.

The multiple gain stage circuits 120 and 122 are coupled in series, and amplify the output signal O1P and the output signal O1N to generate an output signal O2P and an output signal O2N. In some embodiments, a resistance value and a current value of each of the multiple gain stage circuits 120 and 122 may be configured according to the frequencies of the input signal VIN and the input signal VIP. Associated details of the configuration herein are to be described with reference to FIG. 3 below. It should be noted that, in different embodiments, the at least one circuit parameter of each of the multiple equalizer circuits 110, 112 and 114 and the resistance values and the current values of the multiple gain stage circuits 120 and 122 may be independently configured or jointly adjusted according to actual requirements.

The digital offset correction circuit 130 adjusts DC levels of the output signal O1P and the output signal O1N according to the output signal O2P and the output signal O2N. More specifically, the digital offset correction circuit 130 is coupled between the multiple equalizer circuits 110, 112 and 114 and the multiple gain stage circuits 120 and 122. The detector circuit 150 may compare the output signal O2P and the output signal O2N, and execute a predetermined algorithm (for example but not limited to, a successive approximation (SAR) algorithm) according to a comparison result of the output signal O2P and the output signal O2N to generate a control signal SG and a control signal SGB. In some embodiments, the detector circuit 150 includes a comparator (not shown) and a logic control circuit (not shown). The control circuit may compare the output signal O2P and the output signal O2N. The logic control circuit may execute the predetermined algorithm above according to a comparison result generated by the comparator to generate the control signal SG, the control signal SGB and a control signal VB. The digital offset correction circuit 130 may adjust DC levels of the output signal O1P and the output signal O1N according to control signal SG, the control signal SGB and the control signal VB, so as to correct an internal offset within the equalizer device 100. Associated details of the configuration herein are to be described with reference to FIG. 4 below.

The analog offset correction circuit 140 adjusts multiple input levels of the last equalizer circuit (that is, the equalizer circuit 114 that outputs the output signal O1P and the output signal O1N) of the multiple equalizer circuits 110, 112 and 114 according to the output signal O2P and the output signal O2N. More specifically, the analog offset correction circuit 140 is coupled between multiple output nodes (for example, multiple output nodes NO3 and NO3 in FIG. 3; that is, an output terminal) of the gain stage circuit 122 and multiple input nodes (for example, multiple input nodes N11 and N12 in FIG. 2A to FIG. 20; that is, an input terminal). Similarly, the analog offset correction circuit 140 may adjust the multiple input levels of the equalizer circuit 114 according to the output signal O2P and the output signal O2N, so as to correct an internal offset within the equalizer device 100. Associated details of the configuration herein are to be described with reference to FIG. 5 below.

In some embodiments, the digital offset correction circuit 130 is disposed at an output node (for example, the multiple output nodes NO1 and NO2 in FIG. 2A to FIG. 2C; that is, an output terminal) of the last equalizer circuit (that is, the equalizer circuit 114) of the multiple equalizer circuits 110, 112 and 114. With the configuration above, it can be ensured that the adjustment voltage provided by the digital offset correction circuit 130 is amplified merely by the multiple gain stage circuits 120 and 122 but remains free from influences of the multiple equalizer circuits 110 and 112 (which may possibly provide a negative DC gain). Thus, circuit specifications of the digital offset correction circuit 130 can be reduced to promote feasibility. On the other hand, as described above, the analog offset correction circuit 140 is disposed at the input node but not the output node of the equalizer circuit 114. Thus, an output load of the equalizer circuit 140 can be reduced to ensure overall operation performance of the multiple equalizer circuits 110, 112 and 114.

In some embodiments, the multiple equalizer circuits 110, 112 and 114 and the multiple gain stage circuits 120 and 122 operate in a first voltage domain, and the analog offset correction circuit 140 operates in a second voltage domain. For example, as to be described below, the multiple equalizer circuits 110, 112 and 114 and the multiple gain stage circuits 120 and 122 are powered by a supply voltage VDD1, the analog offset correction circuit 140 is powered by a supply voltage VDD2, and the supply voltage VDD1 is lower than the supply voltage VDD2. For example, the supply voltage VDD1 may be, for example but not limited to, 0.9 V, and the supply voltage VDD2 may be, for example but not limited to, 1.8 V. Since the output signal O2P and the output signal O2N (which are input into the analog offset correction circuit 140) are obtained from amplifying the input signal VIN and the input signal VIP, if the analog offset correction circuit 140 operates in the second voltage domain having a higher level, requirements on circuit specifications in the analog offset correction circuit 140 can be effectively eased, so as to lower implementation difficulties of the analog offset correction circuit 140.

For better illustration purposes, the number of equalizer circuits is 3 and the number of gain stage circuits is 2 in the example in FIG. 1; however, the present application is not limited to the examples above. Equalizer devices using various numbers of equalizer circuits and various numbers of gain stage circuits are to be encompassed within the scope of the present application.

Figure 2A:
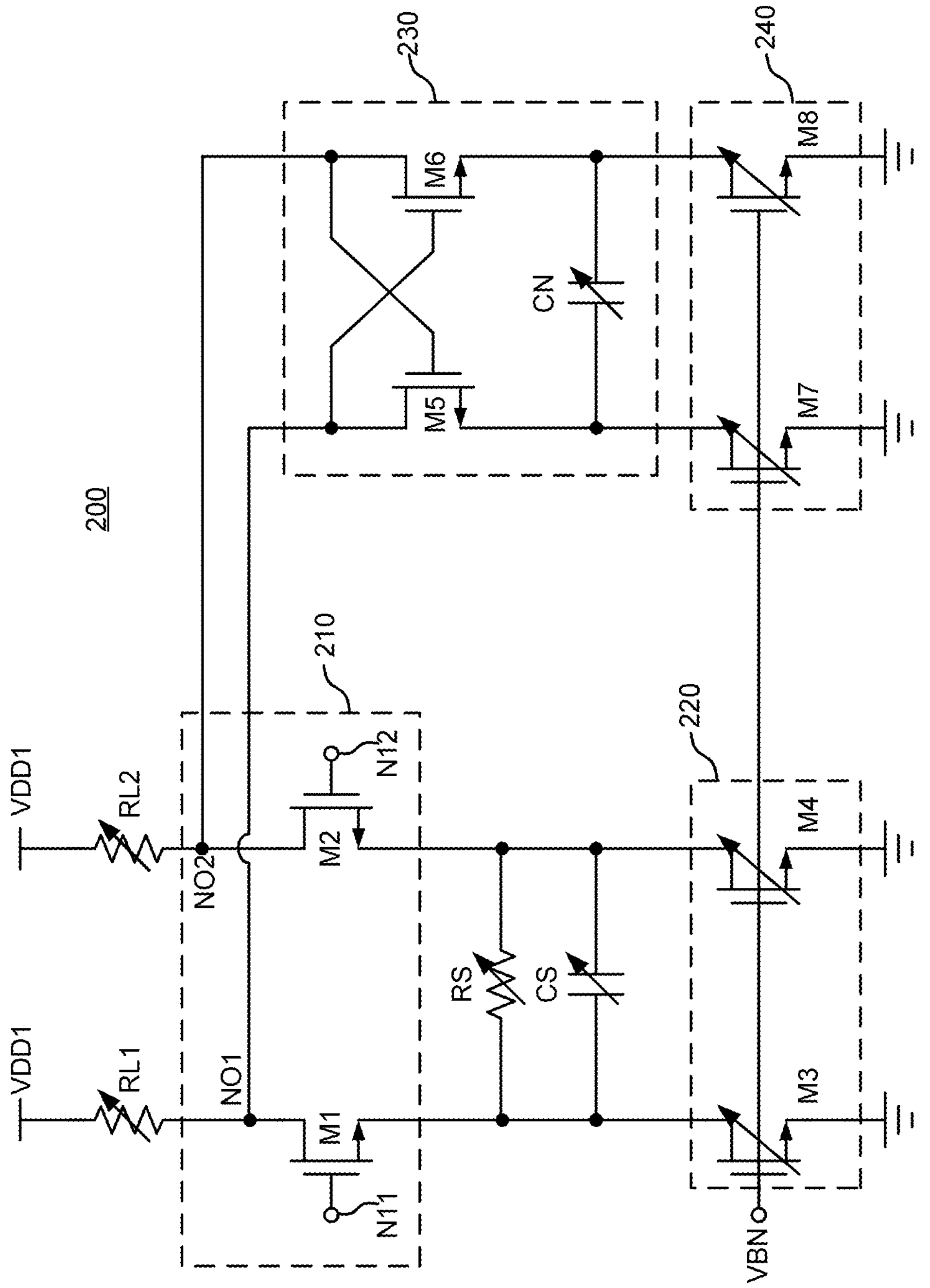
FIG. 2A is a schematic diagram of an equalizer circuit according to some embodiments of the present application.

FIG. 2A shows a schematic diagram of an equalizer circuit 200 according to some embodiments of the present application. In some embodiments, the equalizer circuit 200 may be used to implement at least one of the multiple equalizer circuits 110, 112 and 114 in FIG. 1.

The equalizer circuit 200 includes an input circuit 210, multiple resistors RL1 and RL2, a current source circuit 220, a capacitor CS, a resistor RS, a negative capacitance generation circuit 230 and a current source circuit 240. The input circuit 210 includes multiple nodes N11 and N12 and multiple output nodes NO1 and NO2. The multiple input nodes N11 and N12 may receive the multiple input signals VIN and VIP (that is, when the equalizer circuit 200 is the equalizer circuit 110 in FIG. 1), or may be coupled to the multiple output nodes NO1 and NO2 of the equalizer circuit of the previous stage (that is, when the equalizer circuit 200 is the equalizer circuit 112 or 114 in FIG. 1). For example, if the equalizer circuit 200 is the equalizer circuit 112 in FIG. 1, the multiple input nodes N11 and N12 may be coupled to the multiple output nodes NO1 and NO2 of the equalizer circuit 110 of the previous stage so as to receive an output of the equalizer circuit 110. Similarly, the multiple output nodes NO1 and NO2 may be coupled to the multiple input nodes N11 and N12 of the next-stage equalizer circuit, or may be used to output the multiple output signals O1N and O1P (that is, when the equalizer circuit 200 is the equalizer circuit 114 in FIG. 1). For example, if the equalizer circuit 200 is the equalizer circuit 110 in FIG. 1, the multiple input nodes NO1 and NO2 may be coupled to the multiple output nodes N11 and N12 of the equalizer circuit 112 of the next stage.

More specifically, the input circuit 210 may include a transistor M1 and a transistor M2. A first terminal (for example, the drain) of the transistor M1 is coupled to the output node NO1, a second terminal (for example, the source) of the transistor M1 is coupled to a first end of the capacitor CS and a first end of the resistor RS, and a control terminal (for example, the gate) of the transistor M1 is coupled to the input node N11. A first terminal of the transistor M2 is coupled to the output node NO2, a second terminal of the transistor M2 is coupled to a second end of the capacitor CS and a second end of the resistor RS, and a control terminal of the transistor M2 is coupled to the input node N12. One end of the resistor RL1 and one end of the resistor RL2 are respectively coupled to the output node NO1 and the output node NO2, and the other end of the resistor RL1 and the other end of the resistor RL2 receive the supply voltage VDD1. Thus, the resistor RL1 an the resistor RL2 may transmit the supply voltage VDD1 to the input circuit 210.

The current source circuit 220 generates multiple currents to drive the input circuit 210. More specifically, the current source circuit 220 includes a transistor M3 and a transistor M4. A first terminal of the transistor M3 is coupled to the first end of the capacitor CS and the first end of the resistor RS, a second terminal of the transistor M3 is coupled to ground, and a control terminal of the transistor M3 receives a bias voltage VBN. A first terminal of the transistor M4 is coupled to the second end of the capacitor CS and the second end of the resistor RS, a second terminal of the transistor M4 is coupled to ground, and a control terminal of the transistor M4 receives the bias voltage VBN. The transistor M3 and the transistor M4 may generate the multiple currents above according to the bias voltage VBN to drive the transistor M1 and the transistor M2 in the input circuit 210. The resistor RS and the capacitor CS are coupled in parallel, and are coupled between the input circuit 210 and the current source circuit 220.

The negative capacitance generation circuit 230 is coupled to the multiple output nodes NO1 and NO2 to provide a negative capacitance value to the multiple output nodes NO1 and NO2, so as to increase a bandwidth of the equalizer circuit 200. More specifically, the negative capacitance generation circuit 230 may include a transistor M5, a transistor M6 and a capacitor CN. A first terminal of the transistor M5 is coupled to the output node NO1, a second terminal of the transistor M5 is coupled to a first end of the capacitor CN, and a control terminal of the transistor M5 is coupled to the output node NO2. A first terminal of the transistor M6 is coupled to the output node NO2, a second terminal of the transistor M6 is coupled to a second end of the capacitor CN, and a control terminal of the transistor M6 is coupled to the output node NO1.

The current source circuit 240 generates multiple currents to drive the negative capacitance generation circuit 230. More specifically, the current source circuit 240 includes a transistor M7 and a transistor M8. A first terminal of the transistor M7 is coupled to the first end of the capacitor CN, a second terminal of the transistor M7 is coupled to ground, and a control terminal of the transistor M7 receives the bias voltage VBN. A first terminal of the transistor M8 is coupled to the second end of the capacitor CN, a second terminal of the transistor M8 is coupled to ground, and a control terminal of the transistor M8 receives the bias voltage VBN. The transistor M7 and the transistor M8 may generate the multiple currents above according to the bias voltage VBN to drive the transistor M5 and the transistor M6 in the negative capacitance generation circuit 230.

In this example, each of the resistor RL1, the resistor RL2 and the resistor RS may be a variable resistor, each of the capacitor CS and the capacitor CN may be a variable capacitor, and each of the current source circuit 220 and the current source circuit 240 may be a variable current source circuit. In some embodiments, the peaking frequency corresponding to the frequency response of the equalizer circuit 200 is primarily associated with the resistance values of the resistor RL1 and the resistor RL2. If the input signal VIN and the input signal VIP have lower frequencies, the resistance values of the resistor RL1 and the resistor RL2 may be increased so as to reduce the peaking frequency. Alternatively, if the input signal VIN and the input signal VIP have higher frequencies, the resistance values of the resistor RL1 and the resistor RL2 may be reduced so as to increase the peaking frequency. In some embodiments, the resistance value of the resistor RS may be adjusted along with the resistance values of the resistor RL1 and the resistor RL2, so as to maintain a certain DC gain. In some embodiments, the resistance value of each of the resistor RL1, the resistor RL2 and the resistor RS may be adjusted according to a power of 2; however, the present application is not limited to the example above.

On the other hand, currents flowing through these resistors decrease when the resistance values of the resistor RL1 and the resistor RL2 increase. In this case, current values of the currents generated by the current source circuit 220 and the current source circuit 240 may be reduced. Alternatively, the currents flowing through these resistors increase when the resistance values of the resistor RL1 and the resistor RL2 decrease. In this case, current values of the currents generated by the current source circuit 220 and the current source circuit 240 may be increased. In some embodiments, in practice, the transistors included in each of the current source circuit 220 and the current source circuit 240 may be implemented by multiple transistors connected in parallel. For example, each of the transistors M3, M4, M7 and M8 may be implemented by multiple transistors connected in parallel, and the number of transistors equivalently forming a single transistor (that is, the transistor M3, M4, M7 or M8) by the physical parallel connection may be adjusted to adjust the current value generated. The current generated by the current source circuit 220 (or the current source circuit 240) increases as the number of transistors equivalently forming the single transistor by the physical parallel connection increases. Alternatively, the current generated by the current source circuit 220 (or the current source circuit 240) decreases as the number of transistors equivalently forming the one single transistor by the physical parallel connection decreases. Similarly, by adjusting the numbers of transistors connected in parallel in the current source circuit 220 and the current source circuit 240, the current values of currents generated by the current source circuit 220 and the current source circuit 240 may be adjusted.

In some embodiments, a voltage gain of the peaking frequency of the equalizer circuit 200 is primarily associated with the capacitance value of the capacitor CS. The voltage gain increases as the capacitance value of the capacitor CS increases. In some embodiments, the capacitance value of the capacitor CN may be adjusted along with variations in the capacitance value of the capacitor CS, so as to compensate for influences brought by variations in the capacitance value of the capacitor CS upon the peaking frequency. In some embodiments, a pulse detection circuit (not shown) in a system may configure the respective resistance values of the resistor RL1 and the resistor RL2 as well as the respective current values of the current source circuit 220 and the current source circuit 240 according to a current pulse speed of the system and/or the frequencies of the input signal VIP and the input signal VIN, to adaptively adjust an overall frequency response of the equalizer device 100, so as to further provide equalizer signal processing suitable for the current application.

Figure 2B:
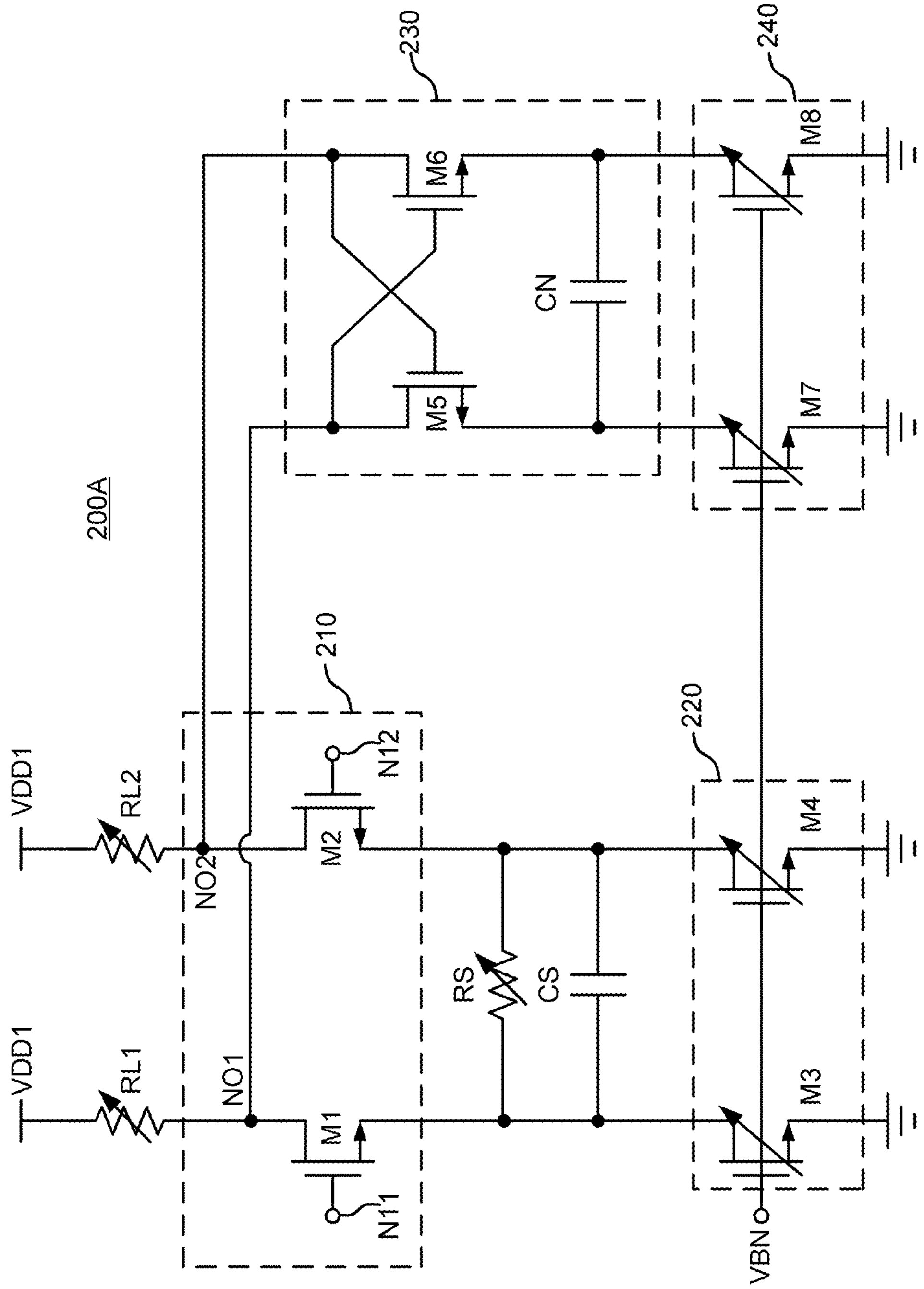
FIG. 2B is a schematic diagram of an equalizer circuit according to some embodiments of the present application.

FIG. 2B shows a schematic diagram of an equalizer circuit 200A according to some embodiments of the present application. In some embodiments, the equalizer circuit 200A may be used to implement at least one of the multiple equalizer circuits 110, 112 and 114 in FIG. 1. Different from the equalizer circuit 200 in FIG. 2A, in this example, the capacitance values of the capacitor CS and the capacitor CN are constant, that is, the capacitor CS and the capacitor CN are non-variable capacitors. In other words, in the equalizer circuit 200A, configurable circuit parameters are the respective resistance values of the resistor RL1 and the resistor RL2 and the respective current values of the current source circuit 220 and the current source circuit 240.

Figure 2C:
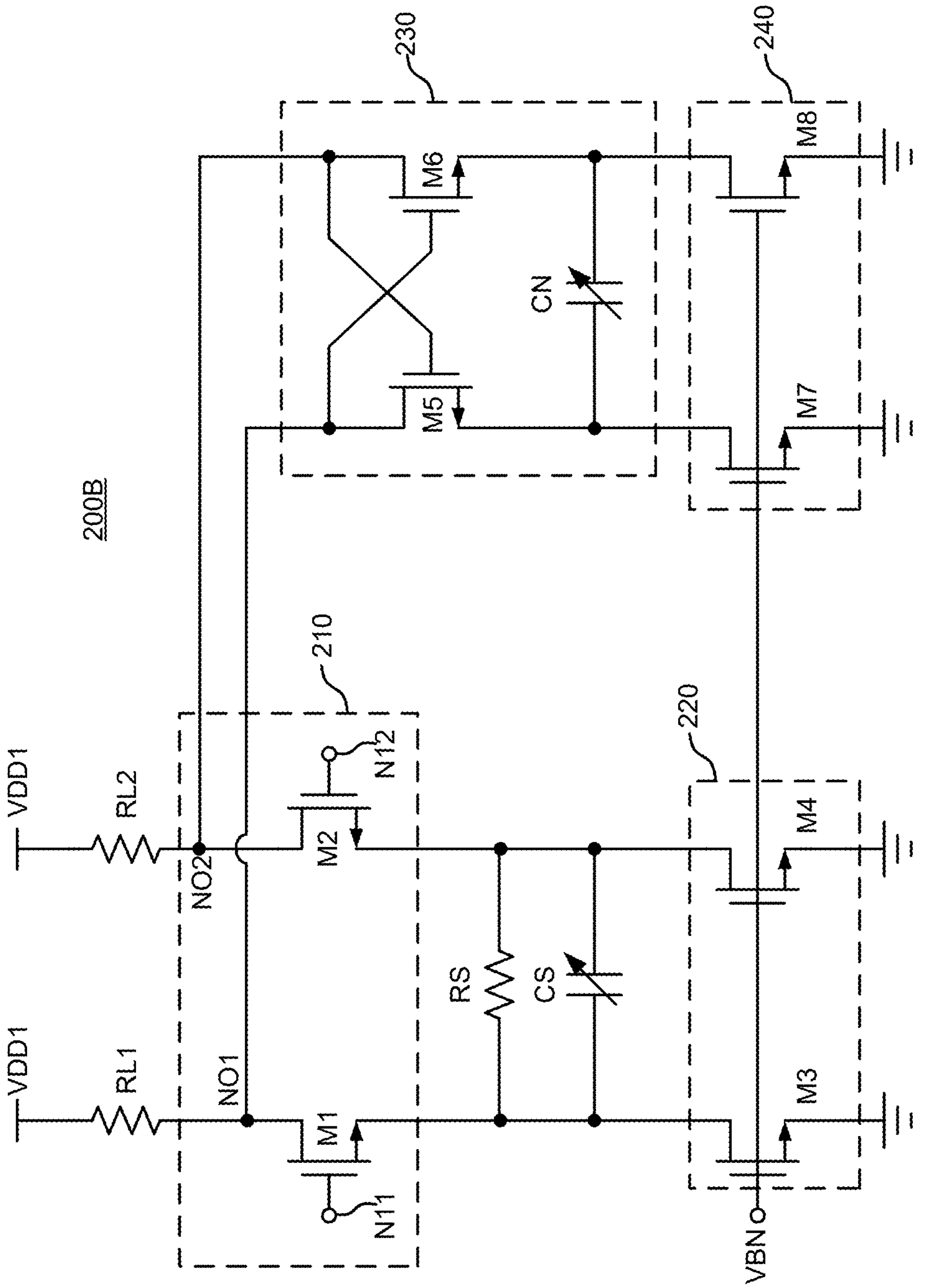
FIG. 2C is a schematic diagram of an equalizer circuit according to some embodiments of the present application.

FIG. 2C shows a schematic diagram of an equalizer circuit 200B according to some embodiments of the present application. In some embodiments, the equalizer circuit 200B may be used to implement at least one of the multiple equalizer circuits 110, 112 and 114 in FIG. 1. Different from the equalizer circuit 200 in FIG. 2A, in this example, the respective resistance values of the resistor RL1, the resistor RL2 and the resistor RS and the respective current values of the current source circuit 220 and the current source circuit 240 are constant, that is, the resistor RL1, the resistor RL2 and the resistor RS are non-variable resistors, and the current source circuit 220 and the current source circuit 240 are constant current source circuits. In other words, in the equalizer circuit 200B, configurable circuit parameters are the respective capacitance values of the capacitor CS and the capacitor CN.

Figure 2D:
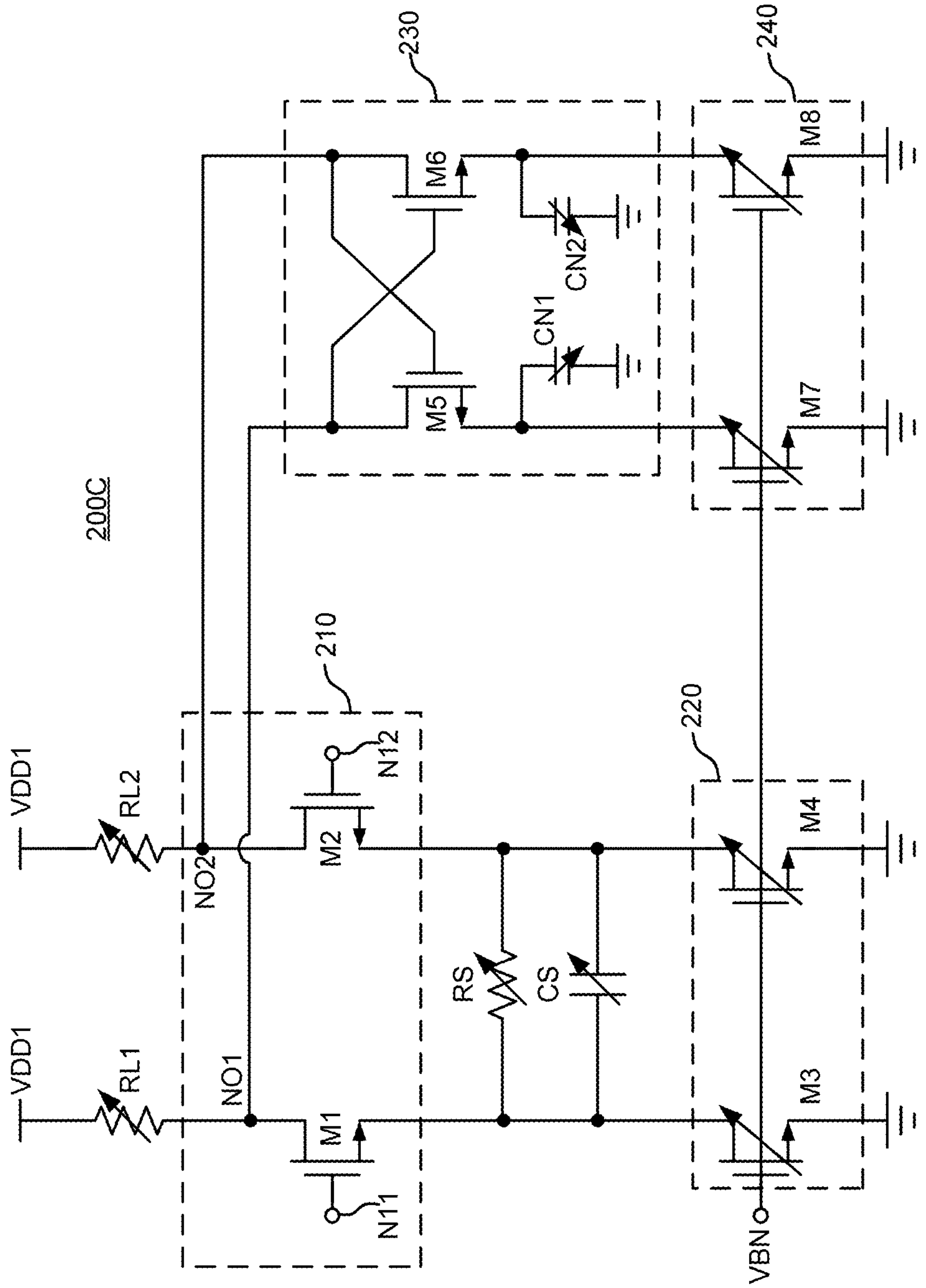
FIG. 2D is a schematic diagram of an equalizer circuit according to some embodiments of the present application.

FIG. 2D shows a schematic diagram of an equalizer circuit 200C according to some embodiments of the present application. In some embodiments, the equalizer circuit 200C may be used to implement at least one of the multiple equalizer circuits 110, 112 and 114 in FIG. 1. Different from the equalizer circuit 200 in FIG. 2A, in the example in FIG. 2D, the capacitor CN in the negative capacitance generation circuit 230 is implemented by a capacitor CN1 and a capacitor CN2 in substitution for the capacitor CN, wherein the capacitor CN1 is coupled between the second terminal of the transistor M5 and ground, and the capacitor CN2 is coupled between the second terminal of the transistor M6 and ground. It can be conceived that the capacitor configuration details are also applicable to the circuits in FIG. 2B and FIG. 2C, and such repeated description is omitted herein.

According to different application requirements, at least one of FIG. 2A, FIG. 2B, FIG. 2C and/or FIG. 2D may be selected to implement the multiple equalizer circuits 110, 112 and 114 in FIG. 1. The configuration details of the equalizer circuits above are merely examples, and are not to be construed as limitation to the present application. Various types of equalizer circuits having a mechanism adaptively adjusting circuit parameters are encompassed within the scope of the present application.

Figure 3:
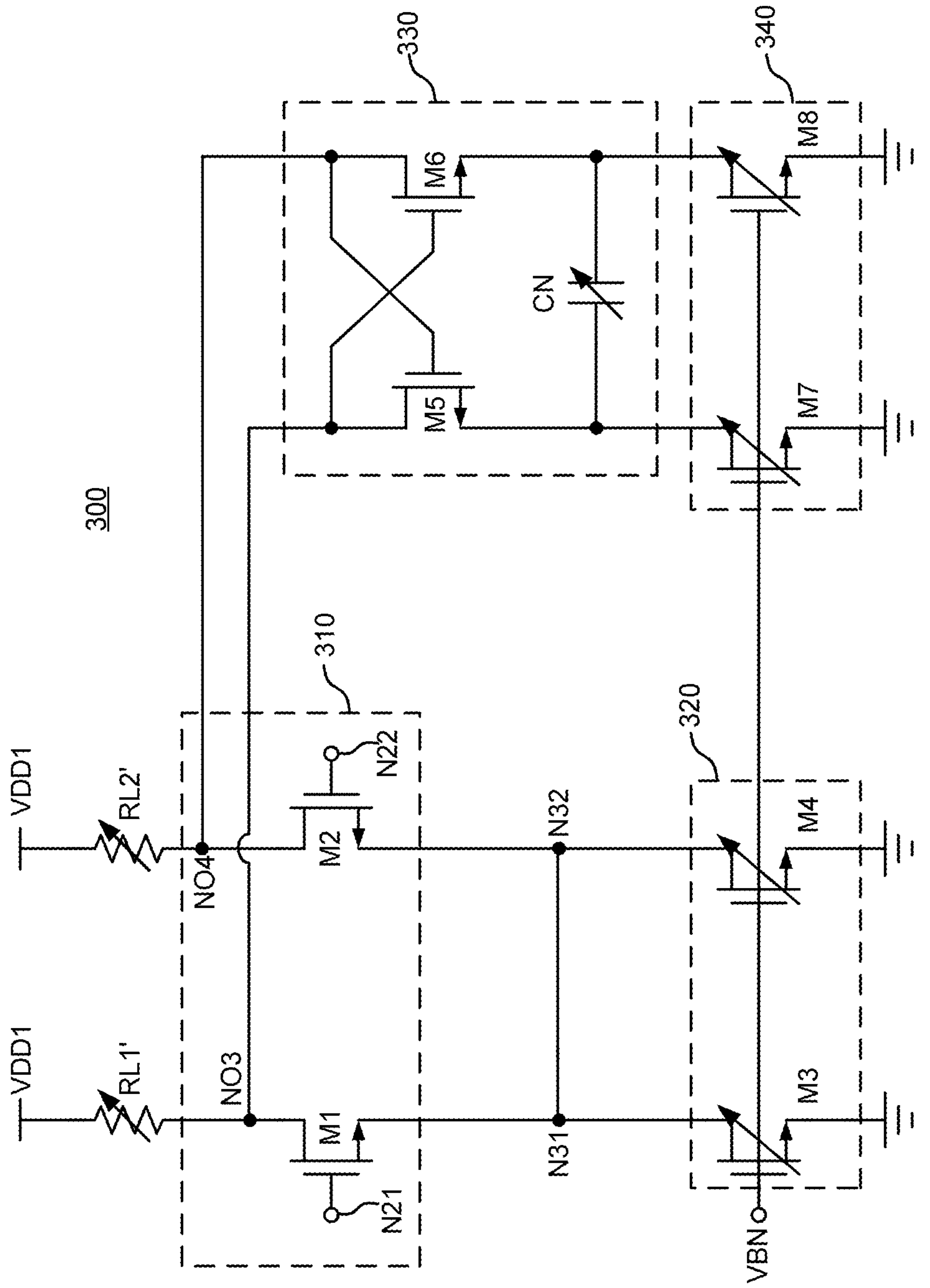
FIG. 3 is a schematic diagram of a gain stage circuit according to some embodiments of the present application.

FIG. 3 shows a schematic diagram of a gain stage circuit 300 according to some embodiments of the present application. In some embodiments, the gain stage circuit 300 may be used to implement the gain stage circuit 120 and the gain stage circuit 122 in FIG. 1.

The gain stage circuit 300 includes an input circuit 310, multiple resistors RL1' and RL2', a current source circuit 320, a negative capacitance generation circuit 330 and a current source circuit 340. The input circuit 310 includes multiple nodes N21 and N22 and multiple output nodes NO3 and NO4. The multiple input nodes N21 and N22 may receive the multiple output signals O1N and O1P (that is, when the gain stage circuit 300 is the gain stage circuit 120 in FIG. 1), or may be coupled to the multiple output nodes NO3 and NO4 of the gain stage circuit of the previous stage (that is, when the gain stage circuit 300 is the gain stage circuit 122 in FIG. 1). For example, if the gain stage circuit 300 is the gain stage circuit 122 in FIG. 1, the multiple input nodes N21 and N22 may be coupled to the multiple output nodes NO3 and NO4 of the gain stage circuit 120 of the previous stage so as to receive an output of the gain stage circuit 120. Similarly, the multiple output nodes NO3 and NO4 may be coupled to the multiple input nodes N21 and N22 of the next-stage gain stage circuit (that is, when the gain stage circuit 300 is the gain stage circuit 120 in FIG. 1), or may be used to output the multiple output signals O2N and O2P (that is, when the gain stage circuit 300 is the gain stage circuit 122 in FIG. 1).

The configuration and corresponding operation details of each of the input circuit 310, the multiple resistors RL1' and RL2', the current source circuit 320, the negative capacitance generation circuit 330 and the current source circuit 340 may be referred from the configuration and corresponding operation details of each of the input circuit 210, the multiple resistors RL1 and RL2, the current source circuit 220, the negative capacitance generation circuit 230 and the current source circuit 240 in FIG. 2A to FIG. 2C, and such repeated description is omitted herein. Similar to the equalizer circuit 200, respective resistance values of the multiple resistors RL1' and RL2' and respective current values of the multiple current sources 320 and 330 in the gain stage circuit 300 may also be configured according to the frequencies of the input signal VIP and the input signal VIN.

Different from FIG. 2A to FIG. 2C, the gain stage circuit 300 does not include the capacitor CS or the resistor RS, and the input circuit 310 and the current source circuit 330 are coupled to a node N31 and a node N32, and the capacitor CN is a non-variable capacitor. In some embodiments, the node N31 and the node N32 may be connected together (that is, shorted).

Figure 4:
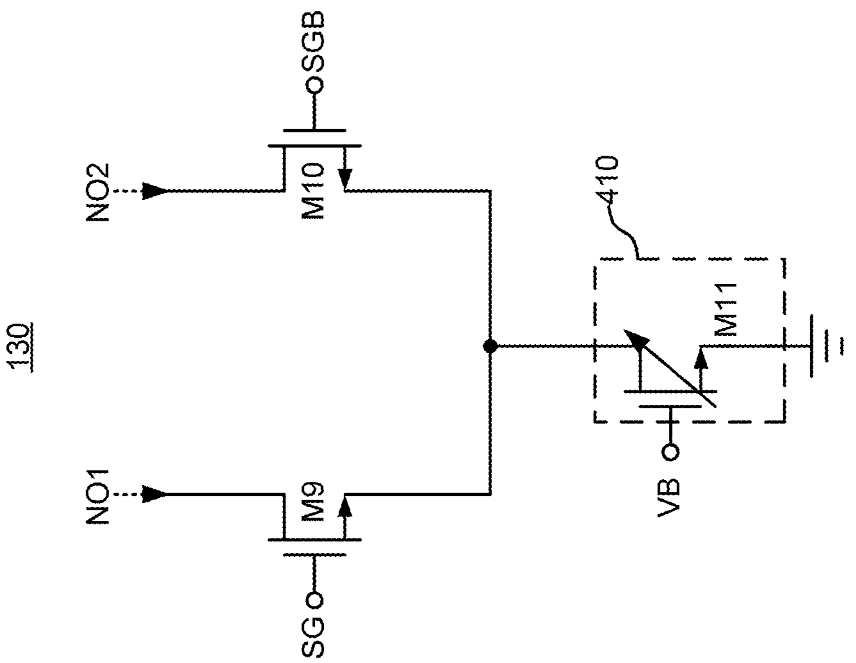
FIG. 4 is a schematic diagram of a digital offset correction circuit in FIG. 1 according to some embodiments of the present application.

FIG. 4 shows a schematic diagram of the digital offset correction circuit 130 in FIG. 1 according to some embodiments of the present application. The digital offset correction circuit 130 includes a transistor M9, a transistor M10 and a current source circuit 410. A first terminal of the transistor M9 is coupled to an output node (for example, the output node NO1 in FIG. 2A to FIG. 2C) of a last equalizer circuit (for example, the equalizer circuit 114 in FIG. 1), a second terminal of the transistor M9 is coupled to the current source circuit 410, and a control terminal of the transistor M9 receives the control signal SG. A first terminal of the transistor M10 is coupled to another output node (for example, the output node NO2 in FIG. 2A to FIG. 2C) of the last equalizer circuit, a second terminal of the transistor M10 is coupled to the current source circuit 410, and a control terminal of the transistor M10 receives the control signal SGB. The current source circuit 410 may generate a current according to the control signal VB so as to drive the transistor M9 and the transistor M10.

With the configuration above, the transistor M9 may be selectively turned on according to the control signal SG to adjust the level of the output node NO1, and the transistor M10 may be selectively turned on according to the control signal SGB to adjust the level of the output node NO2. In some embodiments, the control signal SG and the control signal SGB are logically inverted. Thus, the transistor M9 and the transistor M10 may determine to direct the current generated by the current source circuit 410 to the output node NO1 or to the output node NO2, so as to adjust the level of one of the nodes. In some embodiments, the current source circuit 410 includes a transistor M11. Similar to the current source circuit 220 or the current source circuit 240, the transistor M11 may be implemented by multiple transistors connected in parallel. Moreover, the detector circuit 150 in FIG. 1 may adjust, according to the output signal O2P and the output signal O2N, the number of transistors physically connected in parallel and equivalently forming the transistor M11, so as to adjust a current value generated by the current source circuit 410.

Figure 5:
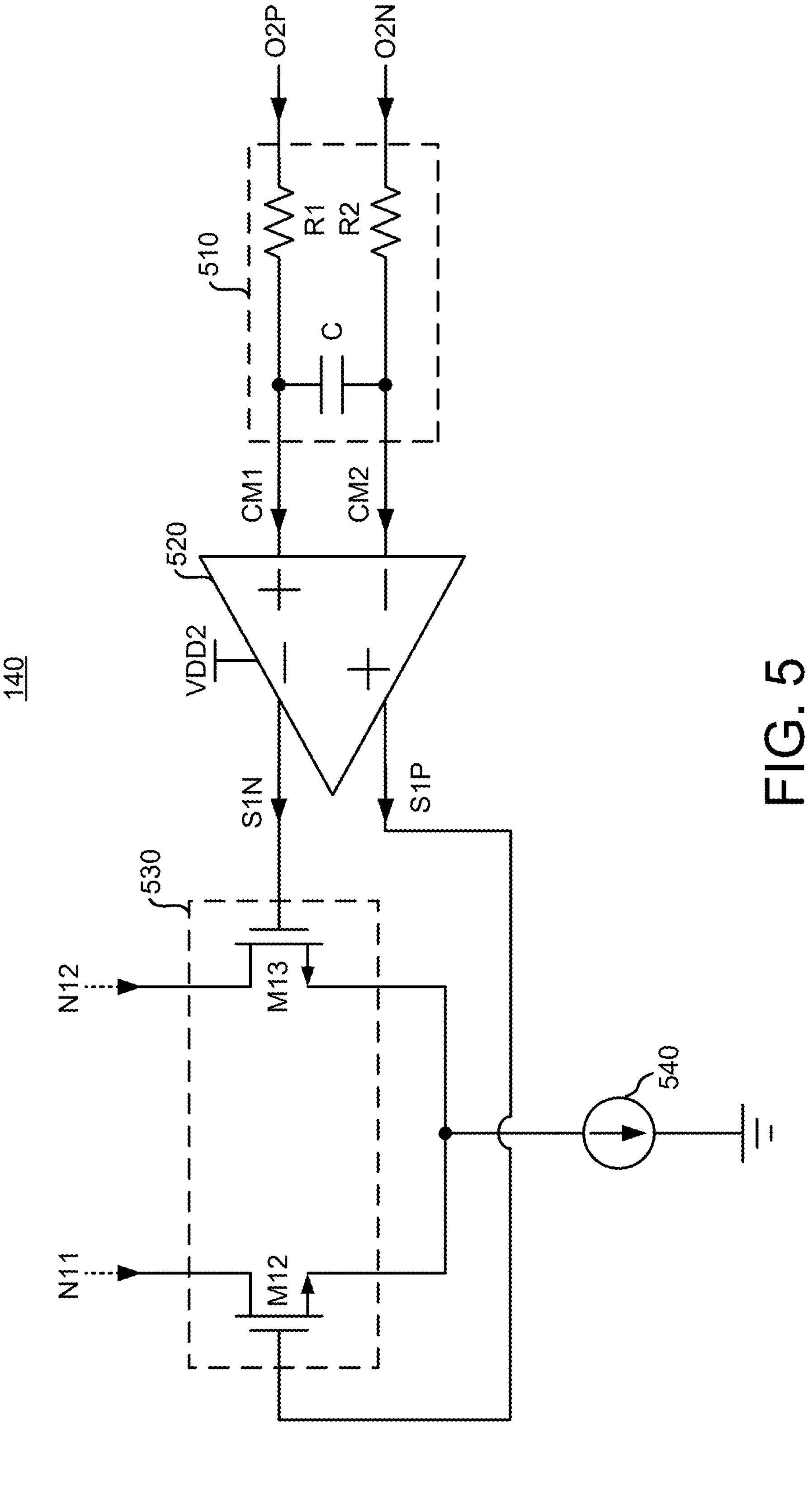
FIG. 5 is a schematic diagram of an analog offset correction circuit in FIG. 1 according to some embodiments of the present application.

FIG. 5 shows a schematic diagram of the analog offset correction circuit 140 in FIG. 1 according to some embodiments of the present application. The analog offset correction circuit 140 includes a conversion circuit 510, an amplifier circuit 520, an input pair circuit 530 and a current source circuit 540. The conversion circuit 510 generates a common mode signal CM1 and a common mode signal CM2 according to the output signal O2P and the output signal O2N. For example, the conversion circuit 510 may include a resistor R1, a resistor R2 and a capacitor C. A first end of the resistor R1 receives the output signal O2P, a first end of the resistor R2 receives the output signal O2N, and the capacitor C is coupled between a second end of the resistor R1 and a second end of the resistor R2. With the configuration above, the conversion circuit 510 is operable as a low-pass filter, so as to retrieve from the output signal O2P and the output signal O2N and output common mode signal components as the common mode signal CM1 and the common mode signal CM2.

The amplifier circuit 520 is powered by the supply voltage VDD2, and generates a signal S1P and a signal S1N according to the common mode signal CM1 and the common mode signal CM2. The current source circuit 540 generates a current to drive the input pair circuit 530. The input pair circuit 530 adjusts multiple input levels (for example, the levels of the multiple input nodes N11 and N12 in FIG. 2A to FIG. 2C) of a last equalizer circuit (for example, the equalizer circuit 114 in FIG. 1) according to the signal S1P and the signal S1N. More specifically, the input pair circuit 530 includes a transistor M12 and a transistor M13. A first terminal of the transistor M12 is coupled to the input node N11 of the equalizer circuit 114, a second terminal of the transistor M12 is coupled to the current source circuit 540, and a control terminal of the transistor M12 receives the control signal S1P. A first terminal of the transistor M13 is coupled to the input node N12 of the equalizer circuit 114, a second terminal of the transistor M13 is coupled to the current source circuit 540, and a control terminal of the transistor M13 receives the control signal S1N. Thus, the transistor M12 and the transistor M13 may generate currents in different values to the input node N11 and the input node N12 of the equalizer circuit 114, so as to adjust the levels of the input node N11 and the input node N12 to further compensate for the internal offset.

In conclusion, the equalizer device provided according to some embodiments of the present application has multiple mechanisms for adjusting circuit parameters. The equalizer device is capable of adaptively configuring the overall frequency response of the equalizer device according to current application requirements so as to meet requirements of use of multiple bandwidths. Moreover, in some embodiments of the present application, multiple offset correction mechanisms are further added with consideration of load effects and implementation difficulties, so as to further correct an internal offset within the equalizer device to further enhance overall performance of the equalizer device.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. An equalizer device, comprising:

a plurality of equalizer circuits, coupled in series, compensating a plurality of input signals to generate a plurality of first output signals;

a plurality of gain stage circuits, coupled in series, amplifying the plurality of first output signals to generate a plurality of second output signals;

a digital offset correction circuit, adjusting DC levels of the plurality of first output signals according to the plurality of second output signals; and an analog offset correction circuit, adjusting a plurality of input levels of a last equalizer circuit of the plurality of equalizer circuits according to the plurality of second output signals, wherein the last equalizer circuit is configured to output the plurality of first output signals.

2. The equalizer device according to claim 1, wherein at least one circuit parameter of each of the plurality of equalizer circuits is configured according to frequencies of the plurality of input signals.

3. The equalizer device according to claim 2, wherein the at least one circuit parameter comprises a current value and a resistance value, a capacitance value, or a combination thereof.

4. The equalizer device according to claim 1, wherein a resistance value and a current value of each of the plurality of gain stage circuits are configured according to frequencies of the plurality of input signals.

5. The equalizer device according to claim 1, wherein the plurality of equalizer circuits and the plurality of gain stage circuits are powered by a first supply voltage, the analog offset correction circuit is powered by a second supply voltage, and the first supply voltage is lower than the second supply voltage.

6. The equalizer device according to claim 1, wherein one of the plurality of equalizer circuits comprises:

an input circuit, comprising a plurality of input nodes and a plurality of output nodes, wherein the plurality of input nodes receive the plurality of input signals, and the plurality of output nodes are coupled to a next-stage equalizer circuit of the plurality of equalizer circuits;

a plurality of first resistors, coupled to the plurality of output nodes, transmitting a supply voltage to the input circuit;

a first current source circuit, generating the plurality of first currents to drive the input circuit;

a first capacitor;

a second resistor, coupled in parallel to the first capacitor, and coupled between the input circuit and the first current source circuit;

a negative capacitance generation circuit, coupled to the plurality of output nodes, providing a negative capacitance value to the plurality of output nodes; and a second current source circuit, configured to generate a plurality of second currents to drive the negative capacitance generation circuit.

7. The equalizer device according to claim 6, wherein each of the plurality of first resistors and the second resistor is a variable resistor, and resistance values of the plurality of first resistors and the second resistor are configured according to frequencies of the plurality of input signals.

8. The equalizer device according to claim 6, wherein the negative capacitance generation circuit comprises a second capacitor, each of the first capacitor and the second capacitor is a variable capacitor, and capacitance values of the first capacitor and the second capacitor are configured according to frequencies of the plurality of input signals.

9. The equalizer device according to claim 6, wherein a current value of each of the plurality of first currents and the plurality of second currents is configured according to frequencies of the plurality of input signals.

10. The equalizer device according to claim 1, wherein one of the plurality of gain stage circuits comprises:

an input circuit, comprising a plurality of input nodes and a plurality of output nodes, wherein the plurality of input nodes receive the plurality of first output signals, and the plurality of output nodes are coupled to a next-stage gain stage circuit of the plurality of gain stage circuits;

a plurality of resistors, coupled to the plurality of output nodes, transmitting a supply voltage to the input circuit;

a first current source circuit, configured to generate a plurality of first currents to drive the input circuit, wherein the first current source circuit and the input circuit are coupled to a first node and a second node, and the first node and the second node are shorted;

a negative capacitance generation circuit, coupled to the plurality of output nodes, providing a negative capacitance value to the plurality of output nodes; and a second current source circuit, configured to generate a plurality of second currents to drive the negative capacitance generation circuit.

11. The equalizer device according to claim 10, wherein each of the plurality of resistors is a variable resistors, and resistance values of the plurality of resistors are configured according to frequencies of the plurality of input signals.

12. The equalizer device according to claim 10, wherein a current value of each of the plurality of first currents and the plurality of second currents is configured according to frequencies of the plurality of input signals.

13. The equalizer device according to claim 1, wherein the digital offset correction circuit comprises:

a first transistor, coupled to a first output node of the last equalizer circuit, selectively turned on according to a first control signal to adjust a level of the first output node;

a second transistor, coupled to a second output node of the last equalizer circuit, selectively turned on according to a second control signal to adjust a level of the second output node, wherein the last equalizer circuit outputs the plurality of first output signals via the first output node and the second output node; and a current source circuit, generating a current to drive the first transistor and the second transistor.

14. The equalizer device according to claim 1, wherein the analog offset correction circuit comprises:

a conversion circuit, generating a plurality of common mode signals according to the plurality of second output signals;

an amplifier circuit, generating a plurality of first signals according to the plurality of common mode signals;

an input pair circuit, adjusting the plurality of input levels of the last equalizer circuit according to the plurality of first signals; and a current source circuit, generating a current to drive the input pair circuit.

* * * * *